United States Patent [19]

Johnson

[11] Patent Number: 4,669,178

[45] Date of Patent: Jun. 2, 1987

[54] PROCESS FOR FORMING A SELF-ALIGNED LOW RESISTANCE PATH IN SEMICONDUCTOR DEVICES

[75] Inventor: Eric D. Johnson, Essex Junction, Vt.

[73] Assignee: International Business Machines Corporation, Armonk, N.Y.

[21] Appl. No.: 866,411

[22] Filed: May 23, 1986

[51] Int. Cl.$^4$ .......................................... H01L 21/425
[52] U.S. Cl. ................................... 29/571; 29/576 B; 156/662; 427/93
[58] Field of Search ............... 427/85, 84, 93; 29/571, 29/576 B; 148/DIG. 70; 357/52; 156/662

[56] References Cited

U.S. PATENT DOCUMENTS

| | | | |
|---|---|---|---|
| 4,261,095 | 4/1981 | Dreves | 357/52 |
| 4,481,041 | 11/1984 | Muller | 29/571 |
| 4,558,508 | 12/1985 | Kinney | 29/571 |
| 4,597,827 | 7/1986 | Nishitani | 29/576 B |

*Primary Examiner*—John D. Smith
*Assistant Examiner*—Vi D. Dang
*Attorney, Agent, or Firm*—Sughrue, Mion, Zinn, Macpeak and Seas

[57] ABSTRACT

A method of forming a low resistance path, e.g., to serve as a guard ring, in a silicon semiconductor device is disclosed.

An opening is defined in an upper protective layer and an underlying lower protective layer. Normally these layers are silicon nitride and silicon dioxide, respectively. The lower protective layer is isotropically wet etched so that the upper protective layer overhangs the lower protective layer and protects a part of the silicon wafer surface.

A first impurity is implanted in the exposed silicon wafer surface except in the annular area protected by the upper protective layer overhang.

A silicon dioxide layer is grown on the entire exposed surface of the silicon wafer which is inherently thicker over the area where the impurity has been implanted and inherently thinner over the annular area where the impurity has not been implanted. The upper protective layer is then preferably removed.

A second impurity is implanted through the annular thinner silicon dioxide layer, which optionally may be etched away, to create, e.g., a guard ring in the silicon wafer around the perimeter of the thicker silicon dioxide layer which has protected the silicon wafer from the implant.

12 Claims, 6 Drawing Figures

PROCESS FOR FORMING A SELF-ALIGNED LOW RESISTANCE PATH IN SEMICONDUCTOR DEVICES

BACKGROUND OF THE INVENTION

1. Field of the Invention

The present invention relates to a process for forming a self-aligned low resistance path to a buried layer in a semiconductor device. The invention may also be applied to the formation of a self-aligned guard ring structure in the semiconductor device.

2. Description of the Prior Art

U.S. Pat. No. 4,261,095 Dreves et al discloses a process for producing a guard ring in a semiconductor device by creating an area under an undercut nitride layer (silicon dioxide being removed) overlying a semiconductor body to expose a contact area around the surface of the body and depositing a barrier material in the opening so that a small space is left around the outer edge of the deposited material and the recessed wall of the underlying silicon dioxide to permit diffusion of a narrow ring around the covered area. This process is more complex than that of the present invention, albeit it is self-aligned.

IBM Technical Disclosure Bulletin, Vol. 26, #9, February 1984, pp. 4498–4499, Chang et al teaches that an overetched oxide hole under a nitride layer can be used to form a polysilicon diffusion source for a guard ring on a semiconductor device.

IBM Technical Disclosure Bulletin, Vol. 21, #7, December 1978, p. 2752, Anantha et al teaches that a guard ring can be created by out-diffusion of boron during deposition of a polysilicon layer.

U.S. Pat. Nos. 4,135,955 Gasner et al; 4,223,334 Gasner et al and 4,468,852 Cerofolini teach various processes for making self-aligned guard rings in CMOS devices.

SUMMARY OF THE INVENTION

The present invention provides a process for forming self-aligned low resistance paths to a buried layer in a semiconductor device, e.g., a self-aligned guard ring, where a lower protective layer, e.g., silicon dioxide, is grown on a silicon wafer, followed by forming an upper protective layer, e.g., of silicon nitride, on the lower protective layer. A window is then formed through the upper protective layer, whereafter the lower protective layer is isotropically etched to form an undercut area under the upper protective layer, i.e., the upper protective layer overhangs the lower protective layer. An impurity is then implanted into the exposed silicon wafer surface through the window, i.e., in an area having a size the same as the opening in the upper protective layer but not in the area where the upper protective layer overhangs the isotropically etched lower protective layer and protects the silicon wafer.

The upper protective layer may then be removed. Since the present invention finds particular application in forming a guard ring, quite often discussion herein will be in the context of forming a guard ring. The present invention is not limited thereto, however. In this case, the area where the upper protective layer overhangs the lower protective layer will be the region of the eventual guard ring.

A silicon dioxide layer is then thermally grown on the entire exposed surface of the silicon wafer, the thermally grown layer inherently being thicker over the area where the impurity has been implanted than over the unimplanted area, i.e., being thicker over the buried layer, typically a guard ring area, and thinner where the upper protective layer overhung the lower protective layer and no impurity was implanted.

A second impurity is then implanted through the thinner silicon dioxide region, which is normally permitted to remain, to dope an annular region on the surface of the underlying silicon wafer around the first thicker silicon dioxide deposit, the thickness of the first silicon dioxide being such that it also blocks the implant, i.e., the silicon dioxide over the first implanted area and inside the earlier mentioned undercut area is made thick enough to mask the buried layer. The thinner silicon dioxide over the undercut area normally is permitted to remain to act as a conventional screen oxide for the second impurity implant.

All protective layers which may remain are then removed along with silicon dioxide and an epitaxial layer can be deposited on the silicon surface, if desired, whereafter conventional device fabrication steps are conducted.

One major aspect of the present invention is to provide a simplified self-aligned process where the differential growth rate of silicon dioxide over a silicon wafer having different impurity doping levels is utilized.

Another object of the present invention is to provide a simplified process for forming a buried layer or surface layer with a guard ring using a single photoresist masking step.

DESCRIPTION OF THE PREFERRED EMBODIMENTS

On a commercial basis, normally the lower protective layer will be silicon dioxide and the upper protective layer will be silicon nitride. As a consequence, in the following discussion, reference is often made to a silicon dioxide lower protective layer and a silicon nitride upper protective layer 30. It should be understood that other materials can be used as long as they provide the complementary relationship between silicon dioxide and silicon nitride later described, most especially to provide the desired "overhang" upon isotropic wet etching.

Figure 1A:
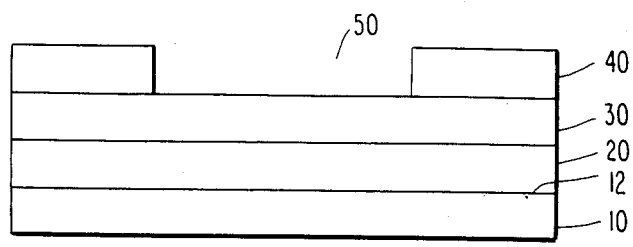
FIGS. 1A to 1F are sectional views illustrating the present invention in various stages of manufacturing a semiconductor device. The FIGs. are not to scale.

Referring now to the FIGs. and especially to FIG. 1A, a wafer of P-type conductivity, e.g., doped with boron, having a resistivity of about 10 to about 20 ohm-cm and a thickness of about 8 to about 16 mils is used as a starting substrate 10. The substrate 10 is a monocrystalline structure which can be fabricated by conventional techniques.

Although the present invention is later discussed primarily in the context of forming a low resistance contact to a buried layer using phosphorus for the contact and arsenic for the buried layer, as will be appreciated by one skilled in the art, such would be formed on a silicon wafer as part of a multiplicity of semiconductor devices, both passive and active, such as transistors, resistors and capacitors. For simplicity in the drawings and ease of illustration, these other devices are not shown in detail in the drawings. Further, though the discussion is often in the context of forming an annular guard ring, as will be apparent to one skilled in the art the low resistance path or contact can serve other purposes.

With reference to FIG. 1A, the surface 12 of the semiconductor wafer 10 is cleaned and there is then formed on surface 12 a layer of silicon dioxide 20, normally to a thickness of about 1000 Å to about 10,000 Å, most typically about 5,000 Å. This silicon dioxide layer 20 can be produced by any conventional process. In one process conveniently used the silicon wafer is heated to about 1000° C. in an oxygen atmosphere which contains a small amount of water, as described in VLSI Fabrication Principles, Ghandi, published in 1983 by John Wiley & Sons, p. 385 or, alternatively, a conventional chemical vapor deposition as described in VLSI Fabrication Principles, Ghandi, published in 1983 by John Wiley & Sons, p. 422 can be used.

Following the formation of the silicon dioxide layer 20, a layer of silicon nitride 30 having a thickness of about 150 Å to about 25,000 Å is formed on the silicon dioxide layer 20. In practice the silicon nitride layer 30 typically will have a thickness of about 2,000 Å. Any conventional method known in the art of forming a silicon nitride layer can be used. One particular method of forming silicon nitride layer 30 known in the semiconductor art comprises a treatment in which dichlorosilane and ammonia are mixed in a carrier gas of hydrogen and introduced into a chamber containing the device at this stage heated to a temperature of about 800° C. At this temperature a reaction occurs resulting in a formatioon of the silicon nitride layer 30 on the silicon dioxide layer 20.

Following the above, a photoresist layer 40 is then formed on the silicon nitride layer 30, for example, a commercially available photoresist such as Shipley AZ 1350 is spun on the silicon wafer, normally to a thickness of about 1 to about 2 microns, and then exposed and removed in a conventional manner to form a window 50 in the photoresist layer 40.

At this stage the device is shown in FIG. 1A.

Figure 1B:
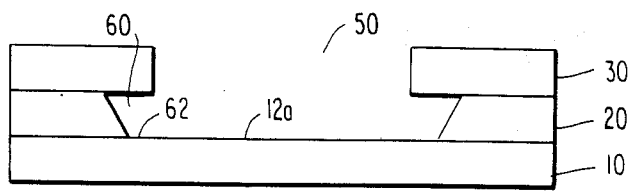

Next, the silicon nitride layer 30 and the silicon dioxide layer 20 are removed in the area of window 50 using the following conventional techniques, and the photoresist is eventually stripped to provide a device as shown in FIG. 1B.

The uppermost silicon nitride layer 30 can be removed in the area of window 50 using a conventional $O_2+CF_4$ plasma etch or a conventional reactive ion etching (RIE). This exposes the silicon dioxide layer 20. Such procedures are disclosed in VLSI Fabrication Principles, Ghandi, published in 1983 by John Wiley & Sons, p. 506. The dry etch will also degrade the photoresist layer 40, but since the photoresist layer 40 is no longer necessary its removal is not harmful. A wet etch in hot phosphoric acid could also be used.

The photoresist may be stripped completely after etching the silicon nitride using a conventional technique such as an $O_2$ plasma ash as disclosed in VLSI Fabrication Principles, Ghandi, published in 1983 by John Wiley & Sons, p. 502.

Once the silicon nitride layer 30 has been etched away in the window region 50, the exposed portion of silicon dioxide layer 20 in window 50 is removed by etching in a buffered hydrofluoric acid solution, typically at a temperature of about 20° C. to about 50° C. for about 1 to about 10 minutes to expose the surface 12a of the semiconductor wafer 10. Etching is normally at room temperature using buffered hydrofluoric acid solutions as are conventional in the art.

When the buffered hydrofluoric acid solution enters window 50 and contacts silicon dioxide layer 20 it etches away silicon dioxide layer 20 not only straight down through the window 50 but also etches the same sideways, i.e., this is an isotropic etch, whereby the silicon dioxide is intentionally undercut under the silicon nitride layer 30 as shown by numeral 60 in FIG. 1B and following FIGs. and area 62 of the semiconductor wafer 10 is "protected" by the overhanging silicon nitride layer 30. The distance that this undercutting penetrates beneath the silicon nitride layer 30 is equal to or greater than the thickness of the silicon dioxide layer 20. Thus, for example, if the silicon dioxide layer 20 is 5,000 Å thick, the amount of undercut 60 at the sides of the window area 50 will also be about 5,000 Å. This occurs because the buffered hydrofluoric acid solution attacks in all directions in the window 50. Follow this etching step, as shown in FIG. 1B, surface 12a of the silicon wafer 10 is exposed.

Figure 1C:
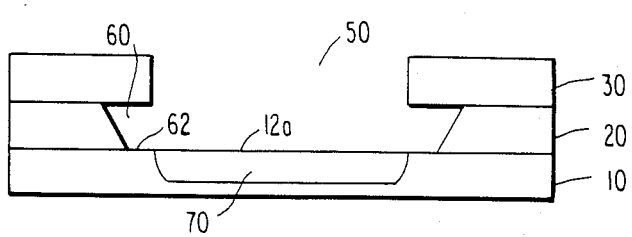

Following the above etching, as explained with reference to FIG. 1C, an N-type impurity, for example, antimony, though most typically arsenic, is implanted into area 12a of the silicon wafer 10 to a doping level on the order of about $10^{20}$ to about $10^{21}$, typically about $5\times10^{20}$ atoms/cm$^3$, at the following conditions: species=75 As+; energy=50 Kev; dose=$5\times10^{16}$ atoms/cm$^2$, whereby buried layer 70 as shown in FIG. 1C is formed. This is an important process step since silicon dioxide can be grown over heavily doped layer 70 to a much greater thickness than at area 62 in undercut 60 which has been protected from the implant by the overhanging silicon nitride layer (doping has not been effected), thereby providing the self-aligning feature of the present invention. It is preferred that the doping level where the thicker silicon dioxide is to be grown be at least about $10^3$ atoms/cm$^3$ (three orders of magnitude) greater than the doping level where the thinner silicon dioxide is to be grown. The thicker silicon dioxide area 82 later described must be sufficiently thick to mask layer 70 against implantation of the second N-type impurity later discussed.

As will be appreciated by one skilled in the art, viewed from above, the area 62 as shown in FIG. 1C completely surrounds layer 70, though the shape thereof may be arbitrarily chosen. Typically it is rectangular (annular) and will hereinafter often be referred to as annular. Similar remarks apply to area 110 shown in FIGS. 1E and 1F. Layer 70 could be, e.g., a subcollector.

Following the above procedure, a conventional drive-in is conducted, for example, typically at about 1100° C. for 20 minutes, in an inert gas atmosphere such as nitrogen. There would be some lateral diffusion of layer 70 during drive-in, but for simplicity this is not shown.

Figure 1D:
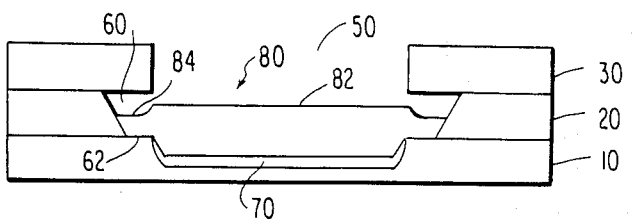

Following drive-in, as explained with reference to FIG. 1D, an oxide layer is then formed over layer 70 and over area 62 in silicon wafer 10. Oxidation is normally at a temperature of about 800° C. to about 1,000° C., most typically at 800° C., in an atmosphere of oxygen and water for about 30 to about 300 minutes, most typically about 30 minutes.

This results in an oxide layer 80 which comprises a very thick area 82 over the heavily doped area 70 and a relatively thin silicon dioxide layer 84 over area 62 where the implanting has not been conducted. Normally the thickness of the silicon dioxide layer 82 is at least about 1.5 to at least about 10 times, more preferably at least about 5 to at least about 10 times, that of the thickness of the silicon dioxide layer 84, and most preferably at least about 10 times the thickness of the silicon dioxide layer 84, though this is not limitative. Conveniently the thin silicon dioxide area 84 has a thickness of about 200 Å to about 300 Å whereas the thickness of the thick silicon dioxide area 82 is about 2,000 Å to about 3,000 Å. The device at this stage has the configuration shown in FIG. 1D.

At this stage of the process of the present invention, a number of alternative sequences can be used as explained with reference to FIG. 1E; following any of these sequences, however, the objective is to form a self-aligned annular layer, e.g., a guard ring area, underneath area 62 in the silicon wafer 10.

A relatively simple procedure is first described and then a more complicated procedure is described.

Following processing as above, silicon nitride layer 30 is etched, typically in a hot phosphoric acid solution, for example, at 165° C. for about 20 to about 60 minutes, to thereby remove silicon nitride layer 30. This exposes the thin silicon dioxide in area 84 as shown in FIG. 1E. The silicon nitride may be removed at any desired point in the process after the first implant and before the second implant in this sequence.

A conventional ion implant can be used to form the annular guard ring area 110, for example, at the following conditions: species=31 P+; energy=20 Kev; dose=$1 \times 10^{15}$ atoms/cm$^2$. As actually shown in FIG. 1E, of course, the annular phosphorus diffused guard ring area 110 has been subjected to a conventional drive-in so as to laterally diffuse the same into layer 70.

Doping is to a conventional level, for example, on the order of about $10^{19}$ atoms/cm$^3$.

The above embodiment could be replaced by the following embodiment; however, the above embodiment is less complex and is thus preferred.

Following processing as above down to the removal of silicon nitride layer 30, silicon dioxide is again isotropically etched in a buffered hydrofluoric acid solution, for example, at room temperature, to thereby remove silicon dioxide area 84; since silicon dioxide area 82 is much thicker than oxide 84 it is not completely removed. This would expose the silicon wafer 10 in area 62 but would leave silicon dioxide 82 over buried layer 70. Since this etch is again isotropic, silicon dioxide layer 20 would also be etched a bit laterally and would have a second step above the area where the silicon dioxide area 84 protected the silicon dioxide layer 20 during the early stages of the etch.

Figure 1E:
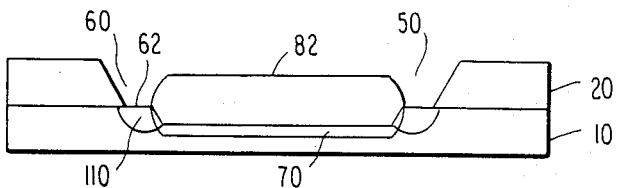

Assuming that the silicon nitride layer 30 has not been removed, a conventional open tube POCl$_3$ diffusion can be carried out to form the annular phosphorus diffused guard ring area 110 as shown in FIG. 1E around layer 70.

Doping would again be is to a conventional level, for example, on the order of about $10^{19}$ atoms/cm$^3$.

Following either of the above procedures, as explained with reference to FIG. 1F, after drive-in of the guard ring area 110 the silicon dioxide layer 20 is stripped off and an epitaxial layer may be grown on the exposed semiconductor wafer 10. The epitaxial layer can be, e.g., deposited by conventional CVD using SiCl$_4$ at a temperature of about 1140° C. to about 1180° C. Depending upon the exact application, the epitaxial layer, shown by numeral 120 in FIG. 1F, can be from submicron thickness to several microns in thickness.

Figure 1F:
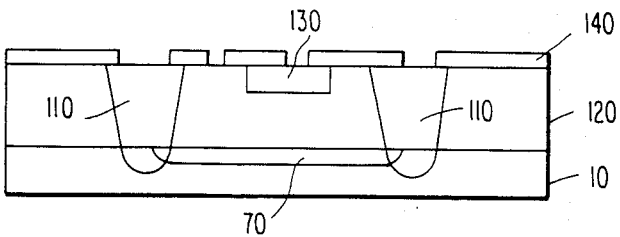

Thereafter, for example, an emitter region can be formed as shown by numeral 130 in FIG. 1F, with conventional metallurgy being formed as shown by 140 in FIG. 1F. Conventional procedures and materials are used.

During growth of the epitaxial layer 120, and subsequent processing, the dopant, e.g., phosphorus, from the annular reach-up area 110, diffuses into the epitaxial layer 120 and can provide a low resistance, self-aligned path to the buried layer region 70 as shown in FIG. 1F.

As shown in FIG. 1F, the self-aligned "reach-up" process of the present invention is used for collector diffusion isolation. See, in this regard *Integrated Circuit Engineering,* Glaser et al, p. 269. It would also be useful in other bipolar integrated circuit technologies such as the buried collector junction isolation process outlined in Glaser et al at page 270. The invention's application is clearly not limited to bipolar technologies as it could be used to form a CMOS well guard ring.

A slightly different application would be a self-aligned guard ring around avalanche photodiodes (VLSI Fabrication Principles, Ghandi, published in 1983 by John Wiley & Sons, pp. 355–356). In this configuration no epitaxial growth is performed subsequent to forming the guard ring.

While there have been described what are at present considered to be the preferred embodiments of this invention, it will be obvious to those skilled in the art that various changes and modifications can be made therein without departing from the invention, and it is, therefore, intended to cover all such changes and modifications as fall within the true spirit and scope of the invention.

What is claimed is:

1. A method of forming a guard ring in a silicon semiconductor device comprising the steps of:
   (a) forming a first protective layer on the surface of a silicon wafer;
   (b) forming a second protective layer on the first protective layer;
   (c) defining an opening in the first protective layer and the second protective layer to expose a selected portion of the silicon wafer surface with the opening in the second protective layer being smaller than the opening in the first protective layer such that the second protective layer overhangs the first protective layer and protects a portion of the silicon wafer;
   (d) implanting a first impurity in a portion of the exposed silicon wafer surface the same size as the opening in the second protective layer and smaller than the opening in the first protective layer;
   (e) thermally growing a silicon dioxide layer on the entire exposed surface of the silicon wafer, wherein the thermally grown silicon dioxide layer is thicker over the area where the impurity has been implanted and thinner over the area where the impurity has not been implanted, thereby forming a central thicker silicon dioxide area and an annular thinner silicon dioxide area therearound;
   (f) implanting a second impurity, the second impurity being implanted through the thinner annular silicon oxide to create a guard ring in the silicon wafer around the perimeter of the thicker silicon dioxide layer which remains; and (g) removing any protective layer from the silicon wafer surface.

2. A method as in claim 1, wherein the first protective layer is silicon dioxide and the second protective layer is silicon nitride.

3. A method as in claim 1, wherein the second protective layer is removed between steps (d) and (f).

4. A method as in claim 2, wherein the second protective layer is removed between steps (d) and (f).

5. A method as in claim 2, wherein in step (e) the silicon dioxide layer is a second silicon dioxide layer, and wherein between steps (e) and (f) the following step (e) is conducted:

etching the second silicon dioxide layer to remove the annular thinner silicon dioxide area while permitting the thicker silicon dioxide area to remain to thereby expose an annular region on the surface of the underlying silicon wafer around the thicker silicon dioxide area.

6. A method as in claim 4, wherein:
in step (a) the silicon wafer is P-type;
in step (d) the first impurity is N-type; and
in step (f) the second impurity is N-type, but differs from the first impurity which is N-type.

7. A method as in claim 1, wherein the thicker silicon dioxide area has a thickness from about 1.5 to about 10 times the thickness of the annular thinner silicon dioxide layer.

8. A method as in claim 7, wherein the annular thinner silicon dioxide layer is about 200 Å to about 300 Å thick and the thicker silicon dioxide layer is about 2,000 Å to about 3,000 Å thick.

9. A method as in claim 8, wherein the first impurity is implanted to a concentration of at least $10^{20}$ atoms/cc.

10. A method as in claim 1, wherein the opening in the first protective layer is formed by a wet etch, whereby said first protective layer is isotropically etched to result in said second protective layer overhanging the first protective layer.

11. A method of forming a guard ring in a P-type silicon semiconductor device comprising the steps of:

thermally growing a first layer of silicon dioxide on the surface of the body;

forming a layer of silicon nitride on the first layer of silicon dioxide;

defining an opening in said layers to expose a selected portion of the silicon surface with the opening in the silicon nitride layer being smaller than the opening in the silicon dioxide layer such that the silicon nitride layer overhangs the opening in the silicon dioxide layer;

implanting an N-type impurity in a portion of the exposed silicon surface the same size as the opening in the silicon nitride material and smaller than the opening in the first layer of silicon dioxide;

thermally growing a second silicon dioxide layer on the entire exposed surface of said silicon body;

the thermally grown layer being thicker over the implanted area than over the unimplanted area;

diffusing an N-type impurity of a different type into the exposed annular silicon surface to create a guard ring in the body, around the perimeter of the thick oxide, the silicon nitride layer being removed prior to this diffusing step; and removing all the oxide layers from said silicon surface.

12. A method of forming a guard ring in a P-type silicon semiconductor device comprising the steps of:

thermally growing a first layer of silicon dioxide on the surface of the body;

forming a layer of silicon nitride on the first layer of silicon dioxide;

defining an opening in said layers to expose a selected portion of the silicon surface with the opening in the silicon nitride layer being smaller than the opening in the silicon dioxide layer such that the silicon nitride layer overhangs the opening in the silicon dioxide layer;

implanting an N-type impurity in a portion of the exposed silicon surface the same size as the opening in the silicon nitride material and smaller than the opening in the first layer of silicon dioxide;

thermally growing a second silicon dioxide layer on the entire exposed surface of said silicon body;

the thermally grown second silicon dioxide layer being thicker over the implanted area than over the unimplanted area;

etching the second silicon dioxide layer to remove the thinner silicon dioxide over the unimplanted area to expose an annular region on the surface of the underlying silicon body around the thicker silicon dioxide deposit;

diffusing an N-type impurity of a different type into the exposed annular silicon surface to create a guard ring in the body, around the perimeter of the thicker silicon dioxide; and removing all the silicon dioxide layers from said silicon surface.

* * * * *